United States Patent [19]
Tai et al.

[11] Patent Number: 6,121,095
[45] Date of Patent: Sep. 19, 2000

[54] METHOD FOR FABRICATING GATE OXIDE

[75] Inventors: Yu-Shan Tai; H. T. Yang; Hsueh-Hao Shih, all of Hsinchu; Kuen-Chu Chen, Chu-Tung Town, all of Taiwan

[73] Assignee: United Integrated Circuits Corp., Hsinchu, Japan

[21] Appl. No.: 09/191,913

[22] Filed: Nov. 13, 1998

[30] Foreign Application Priority Data

Jul. 24, 1998 [TW] Taiwan .................................. 87112101

[51] Int. Cl.$^7$ .......................... H01L 21/336; H01L 21/31
[52] U.S. Cl. ............................................. 438/287; 438/773
[58] Field of Search ................................... 438/287, 264, 438/591, 594, 773

[56] References Cited

U.S. PATENT DOCUMENTS

| | | | |
|---|---|---|---|
| 4,975,387 | 12/1990 | Prokes et al. | 437/131 |
| 5,096,842 | 3/1992 | Nihira et al. | 437/31 |
| 5,656,516 | 8/1997 | Suzuki | 437/773 |
| 5,854,505 | 12/1998 | Suzuki et al. | 257/410 |
| 5,902,452 | 5/1999 | Cheng et al. | 156/657 |

FOREIGN PATENT DOCUMENTS

| | | | |
|---|---|---|---|
| 0212821 | 1/1999 | Japan | 21/316 |
| 1116903 | 1/1999 | Japan | 21/316 |

*Primary Examiner*—John F. Niebling
*Assistant Examiner*—Walter L. Lindsay, Jr.
*Attorney, Agent, or Firm*—J. C. Patents; Jiawei Huang

[57] ABSTRACT

A method for fabricating gate oxide includes a dilute wet oxidation process with additional nitrogen and moisture and an annealing process with a nitrogen base gas, wherein the volume of additional nitrogen is about 6–12 times of the volume of the additional moisture. The method according to the invention improves the electrical quality of the gate oxide by raising the $Q_{bd}$ and by reducing the leakage current of the gate oxide.

5 Claims, 1 Drawing Sheet

METHOD FOR FABRICATING GATE OXIDE

CROSS-REFERENCE TO RELATED APPLICATION

This application claims the priority benefit of Taiwan application Ser. No. 87112101, filed Jul. 24, 1998, the full disclosure of which is incorporated herein by reference.

BACKGROUND OF THE INVENTION

1. Field of the Invention:

This invention relates to a method for fabricating a semiconductor device, and more particularly, to a method for fabricating gate oxide, which improves the electrical quality of a gate oxide layer.

2. Description of Related Art:

Since gate oxide is one of the important components in a metal-oxide-semiconductor (MOS) device, the electrical quality of the gate oxide directly affects the quality of a MOS device. Conventionally, a wet oxidation process is usually performed on a gate oxide layer that exceeds 200 Å in thickness. In a current very-large-semiconductor-integration (VLSI) process, the gate oxide layer used in a MOS device, which has a thickness of about 100–200 Å, is normally formed by a dry oxidation process in the presence of $C_2H_2Cl_2$ vapor.

If the required thickness of gate oxide is thinner than 100 Å, perhaps even as thin as about 50 Å, such as the tunneling oxide within a flash memory, the method for fabricating gate oxide is normally a dry oxidation. However, if the required thickness of the gate oxide is thinner than 50 Å, it is very difficult to obtain a high-quality gate oxide layer through a conventional oxidation process.

As shown in FIG. 1, which is a flowchart represents a conventional method for fabricating gate oxide, an oxidation process is performed on a provided silicon substrate in step 10. A gate oxide layer is formed on the silicon substrate by performing a thermal oxidation in an environment filled with oxygen at a temperature of about 900°–100° C. Then, in step 20, an annealing process is performed in an environment filled with gas, such as nitrogen or inert gases, at a temperature of about 900°–1100° C. This eliminates the stress within the gate oxide layer caused by defects.

A gate oxide layer with a thickness of about 40 Å formed by the foregoing method has a measured breakdown charge ($Q_{bd}$) equal to or less than 5 coulombs per square centimeter. A measured leakage current through the gate oxide layer is about $34.6 \times 10^{-8}$ amperes under a 3.2-volt gate voltage. This shows that the electrical quality of the thin gate oxide is not acceptable.

SUMMARY OF THE INVENTION

It is therefore an objective of the present invention to provide a method for fabricating gate oxide that improves the electrical quality of a gate oxide by raising the $Q_{bd}$ and reducing the leakage current of the gate oxide layer.

In accordance with the foregoing objective of the present invention, the invention provides a method for fabricating gate oxide that includes providing a silicon substrate, performing an oxidation process, and performing an annealing process. The oxidation process includes a dilute wet oxidation in an environment filled with oxygen, moisture, and nitrogen at a temperature of about 750°–900° C. to form a gate oxide layer over the substrate, wherein the volume of filled nitrogen is about 6 to 12 times of the volume of filled moisture. The gas used in the annealing process includes nitrogen at a temperature of about 800°–1200° C.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
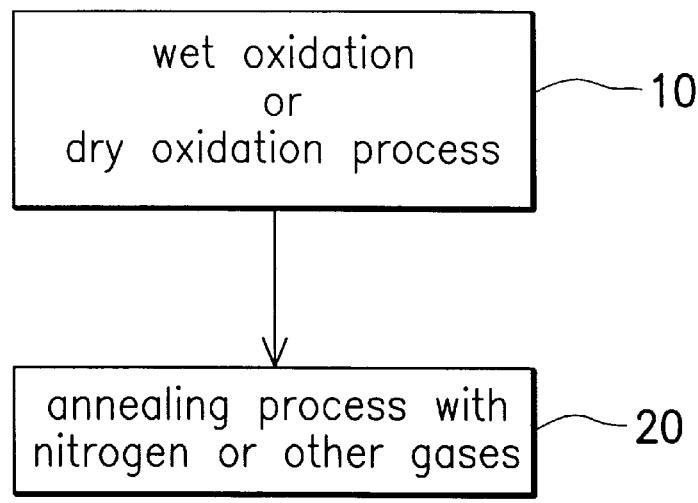
FIG. 1 is a flowchart showing a conventional method for fabricating gate oxide.
Figure 2:
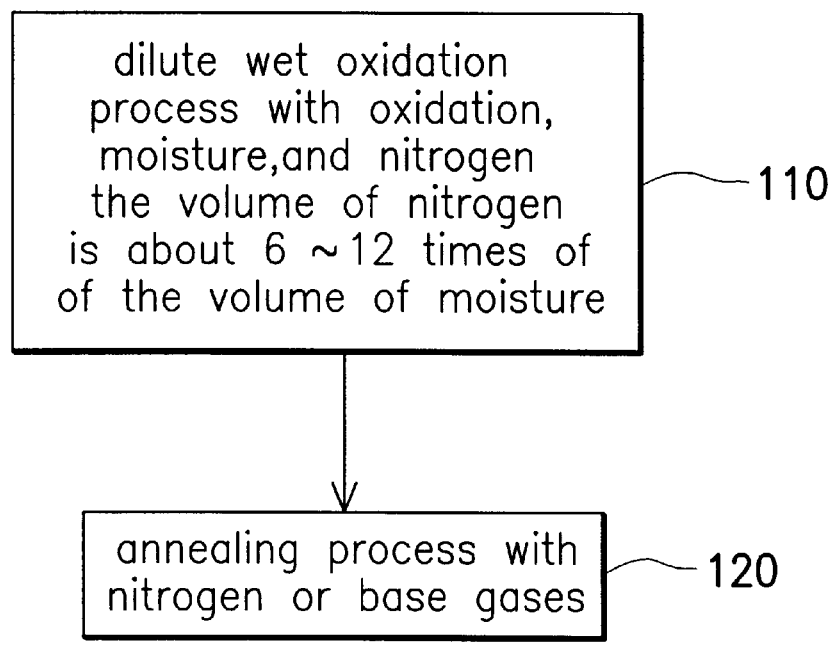
FIG. 2 is a flowchart showing the method for fabricating gate oxide of a preferred embodiment according to the invention.

The invention provides a new method for fabricating gate oxide. FIG. 2 is a flowchart showing the method for fabricating gate oxide according to the invention.

FIG. 2 shows step 110, in which a dilute wet oxidation process is performed in a environment filled with oxygen, moisture, and dilute gas at a temperature of about 750°–900° C. to form a gate oxide layer. The dilute gas includes inert gas such as nitrogen. The volume of the dilute gas is about 6–12 times of the volume of the moisture. Then, an annealing process is performed on the gate oxide layer to eliminate the stress within the gate oxide layer caused by defects within the gate oxide. The annealing process is performed in the presence of a gas, such as $N_2O$, NO, or other nitrogen base gases, at a temperature of about 800°–1200° C.

The gate oxide with a thickness of about 40 Å formed by the method of the foregoing preferred embodiment according to the invention has a measured $Q_{bd}$ equal to or less than 15 Coulombs per square centimeter. This is about three times that of a conventional gate oxide. Such a gate oxide also has a leakage current of about $16 \times 10^{-8}$ amperes under a gate voltage of 3.2 volts, which is about half the leakage current of a conventional gate oxide.

It is obvious that the method for fabricating gate oxide according to the invention improves the electrical quality of gate oxide by raising the $Q_{bd}$ and reducing the leakage current.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating gate oxide, the method comprising:

providing a silicon substrate;

forming the gate oxide by performing a dilute wet oxidation process with additional nitrogen and moisture, wherein the nitrogen has a volume of about 6 to 12 times the moisture's volume; and performing an annealing process with a nitrogen base gas on the gate oxide.

2. The method of claim 1, wherein the dilute wet oxidation is performed at a first temperature of about 750°–900° C.

3. The method of claim 1, wherein the annealing process is performed at a second temperature of about 800°–1200° C.

4. The method of claim 1, wherein the nitrogen base gas includes $N_2O$.

5. The method of claim 1, wherein the nitrogen base gas includes NO.

* * * * *